United States Patent
Richardson et al.

(10) Patent No.: US 7,727,590 B2
(45) Date of Patent: Jun. 1, 2010

(54) ROBUST FILAMENT ASSEMBLY FOR A HOT-WIRE CHEMICAL VAPOR DEPOSITION SYSTEM

(75) Inventors: Christine Richardson, Northboro, MA (US); Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 311 days.

(21) Appl. No.: 11/798,931

(22) Filed: May 17, 2007

(65) Prior Publication Data

US 2008/0095937 A1  Apr. 24, 2008

Related U.S. Application Data

(60) Provisional application No. 60/801,557, filed on May 18, 2006.

(51) Int. Cl.
    *C23C 16/00* (2006.01)
(52) U.S. Cl. .................. 427/249.11; 118/718
(58) Field of Classification Search ............. 427/249.11
    See application file for complete search history.

(56) References Cited

U.S. PATENT DOCUMENTS

| 5,147,826 | A |   | 9/1992 | Liu et al. |
| 5,888,591 | A | * | 3/1999 | Gleason et al. ............. 427/522 |
| 2001/0002324 | A1 |   | 5/2001 | Maekawa et al. |
| 2001/0031541 | A1 | * | 10/2001 | Madan et al. ............... 438/482 |
| 2002/0189545 | A1 | * | 12/2002 | Matsumura et al. ......... 118/724 |
| 2004/0182600 | A1 | * | 9/2004 | Kawabata et al. ........... 174/250 |
| 2006/0108688 | A1 |   | 5/2006 | Richardson et al. |
| 2008/0050523 | A1 | * | 2/2008 | Kitazoe et al. ......... 427/255.26 |

FOREIGN PATENT DOCUMENTS

WO  PCT/JP05/05566  * 10/2005

OTHER PUBLICATIONS

Keshner et al., "Study of Potential Cost Reductions Resulting from Super-Large-Scale Manufacturing of PV Modules," NREL Report for Subcontract No. ADJ-3-33631-01, 2004, two pages.

Makihira et al., "Enhanced nucleation in solid-phase crystallization of amorphous Si by imprint technology," Applied Physics Letters, Jun. 19, 2000, 76(25):3774-3776.

Mason, Maribeth Swiatek, "Synthesis of Large-Grained Polycrystalline Silicon by Hot-Wire Chemical Vapor Deposition for Thin Film Photovoltaic Applications," Ph.D. Thesis, California Institute of Technology, 2004, 89 pages.

Rath, J.K., "Low temperature polycrystalline silicon: a review on deposition, physical properties and solar cell applications," Solar Energy Materials and Solar Cells, Apr. 1, 2003, 76(4):431-487.

(Continued)

*Primary Examiner*—Timothy H Meeks
*Assistant Examiner*—Joseph Miller, Jr.
(74) *Attorney, Agent, or Firm*—Foley & Lardner LLP

(57) ABSTRACT

A hot wire chemical vapor deposition apparatus comprises a vacuum chamber, a substrate support member located in the vacuum chamber, a filament assembly support member located in the vacuum chamber, a precursor gas inlet located in the vacuum chamber and a device for providing a clean portion of at least one filament inside the vacuum chamber without breaking vacuum.

3 Claims, 4 Drawing Sheets

OTHER PUBLICATIONS

Schropp et al., "Poly-silicon films with low impurity concentration made by hot wire chemical vapour deposition," Solar Energy Materials and Solar Cells, Issues 1-4, Jan. 2001, pp. 541-547.

Wolf et al., *Silicon Processing for the VLSI Era*, vol. 1, "Process Technology,", 1986, pp. 137-138.

* cited by examiner

ROBUST FILAMENT ASSEMBLY FOR A HOT-WIRE CHEMICAL VAPOR DEPOSITION SYSTEM

CROSS-REFERENCE TO RELATED PATENT APPLICATIONS

This application claims benefit of priority of U.S. Provisional Application Ser. No. 60/801,557, filed May 18, 2006, incorporated herein by reference in its entirety.

BACKGROUND OF THE INVENTION

The present invention relates generally to the field of chemical vapor deposition, and specifically, to hot wire chemical vapor deposition (HWCVD).

The HWCVD process typically entails decomposition of a precursor gas on the surface of a metal catalyst filament whereby product(s) of the decomposition reaction are deposited on a substrate. However, with continued use, filaments (e.g. tungsten filaments) typically degrade and change surface chemistry. For example, precursor species, such as silane, can react with the tungsten filament surface to form a layer of tungsten silicide and/or amorphous silicon thereon. Consequently, the deposition conditions can also change since the surface chemistry of the filaments is altered. In order to maintain a more constant reaction condition during a deposition run or during successive depositions, it would be beneficial to deal with this issue.

SUMMARY OF THE INVENTION

In one embodiment, a method of performing hot wire chemical vapor deposition comprises providing a substrate inside a vacuum chamber; generating a vacuum in the vacuum chamber; providing a stream of a precursor gas into the vacuum chamber to deposit a layer on the substrate and to generate a used portion of at least one catalyst filament; and providing a clean portion of at least one catalyst filament in the vacuum chamber without breaking vacuum.

In another embodiment, a HWCVD apparatus comprises (a) a vacuum chamber, (b) a substrate support member located in the vacuum chamber, (c) a catalyst filament assembly support member located in the vacuum chamber, (d) a precursor gas inlet located in the vacuum chamber and (e) a means for replacing a used portion of at least one catalyst filament with a clean portion of at least one catalyst filament without breaking vacuum.

In another embodiment, a hot wire chemical vapor deposition apparatus comprises (a) a vacuum chamber, (b) a substrate support member located in the vacuum chamber, (c) a catalyst filament assembly support member located in the vacuum chamber, (d) a precursor gas inlet located in the vacuum chamber, and (e) a device adapted for providing a clean portion of at least one catalyst filament t inside the vacuum chamber without breaking vacuum.

DETAILED DESCRIPTION OF THE PREFERRED EMBODIMENTS

Embodiments of the present invention describe apparatuses and methods for carrying out HWCVD. In one aspect, the embodiments describe a HWCVD process with a more consistent deposition condition(s) during a deposition run or during successive depositions. In another aspect, the embodiments provide a more efficient HWCVD process. For example, the time required for changing catalyst filaments between successive runs may be reduced when vacuum is not required to be broken.

Figure 1:
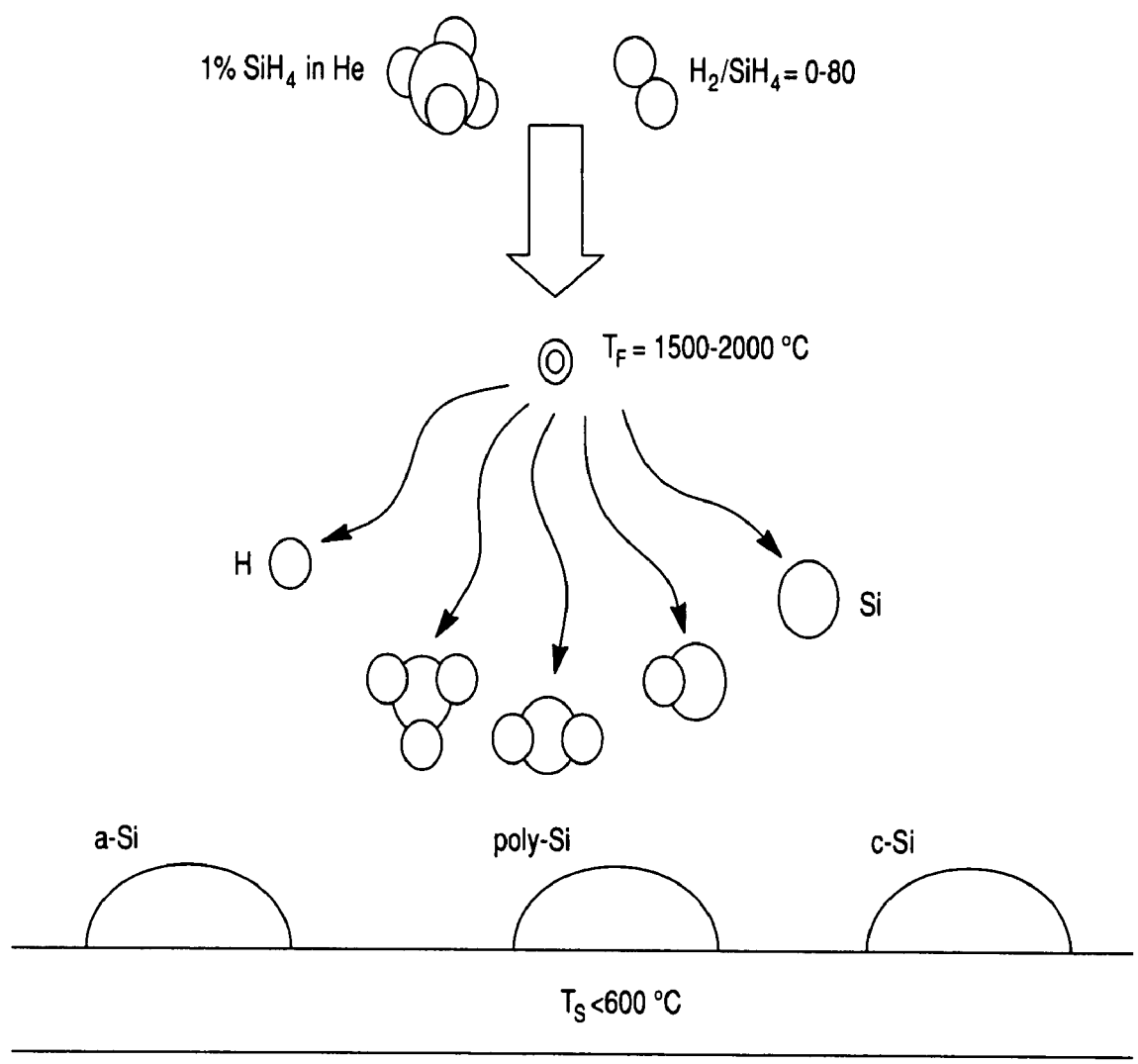
FIG. 1 is an illustration depicting decomposition of silane precursor gases on a filament to deposit silicon layers of various crystal structure on a substrate.

The embodiments are described in the context of HWCVD growth of silicon layers without being particularly limited thereto and other material layers may be deposited. HWCVD growth of silicon layers involves the decomposition of gas precursors on a heated refractory metal catalyst filament producing radical species which react in the gas phase and deposit a layer onto a heated substrate, as shown in FIG. 1. The resulting structure of HWCVD layer can be controlled by controlling several parameters, such as the filament temperature and material, growth pressure, gas flow rates and substrate temperature. HWCVD is generally known by ones of ordinary skill in the art, see e.g. 1) J. K. Rath, Solar Energy Materials & Solar Cells 76 (2003) 431-487, incorporated hereby by reference in its entirety; 2) Maribeth Swiatek Mason "Synthesis of Large-Grained Polycrystalline Silicon by Hot-Wire Chemical Vapor Deposition for Thin Film Photovoltaic Applications" Ph. D. Thesis, Calif. Institute of Technology, Pasadena, Calif., 2004, incorporated hereby by reference in its entirety, and, in particular, chapter 2, pages 7-10, discussing HWCVD and its applications for thin-film photovoltaics.

To achieve epitaxial growth using HWCVD, the deposition rate can be low. For example, the deposition rate can be lower than about 20 nm/min, such as lower than about 10 nm/min. The exemplary deposition rate can range from about 0.1 nm/min to about 8 nm/min. To promote epitaxial growth, a silicon containing precursor gas used together with hydrogen. Hydrogen passivates the low angle grain boundaries in the deposited silicon layer. Passivation with hydrogen during the HWCVD process can be allow for millisecond minority carriers lifetimes in the deposited polysilicon layer, which is similar to bulk silicon. Examples of silicon containing precursors include silicon tetrachloride ($SiCl_4$), thrichrosilane ($SiHCl_3$), dichlorosilane ($SiH_2Cl_2$), and silane ($SiH_4$). The preferred silicon containing precursor for HWCVD is silane. The hydrogen to silicon containing precursor ratio can range from about 500:1 to 0.1:1, or from about 80:1 to about 1:1, or from about 60:1 to about 10:1. The exemplary hydrogen to silicon containing precursor ratio can be about 50:1. The silicon containing precursor can be provided in mixture with a carrier gas such as nitrogen, helium, neon, argon or any combination thereof. The concentration of the silicon containing precursor in the carrier gas can range from about 0.001% to about 100%, or from 0.01% to about 10%, or from about 0.1% to about 5%. The exemplary concentration of silicon containing precursor in the carrier gas can be about 1%. The total pressure can range from about 10 to about 200 mTorr, or from about 50 to about 200 mTorr, or from about 75 to about 125 mTorr. When epitaxial deposition of doped silicon is desired, the mixture can further contain dopant precursor, such as a dopant hydride. The dopant precursors are generally known to ordinary artisan, see in S. Wolf and R. Tauber "Silicon Processing for the VLSI Era", volume 1, "Process Technology", Lattice Press, Sunset Beach, Calif., 1986, incorporated herein by reference in its entirety, including, in particular, pages 137-138. The particular examples of the dopant precursors include diborane ($B_2H_6$) or trimethylboride to incorporate boron, phosphine ($PH_3$) to incorporate phosphorous, arsine ($AsH_3$) to incorporate arsenic and ammonia ($NH_3$) to incorporate nitrogen.

An apparatus for manufacturing a thin film polycrystalline Si cell can include a multichamber cluster tool for performing several high vacuum deposition steps. The cluster tool can comprise at least 3 HWCVD chambers (p-type, n-type, and SiN) and a chamber for the metallization (sputtered or evaporated). Redundancy can be preferable so that if one chamber is down the entire system will not be down, for a total of 8 chambers and a load lock. Alternatively, instead of purchasing the substrate already coated, a glass, silicon or another substrate can also be coated in a metallization chamber attached to the cluster tool. Moreover, a scrubber can be used for bulk cleansing the glass substrates. The deposited silicon layer may be used in a solar cell, a transistor or any other suitable device.

Figure 2:
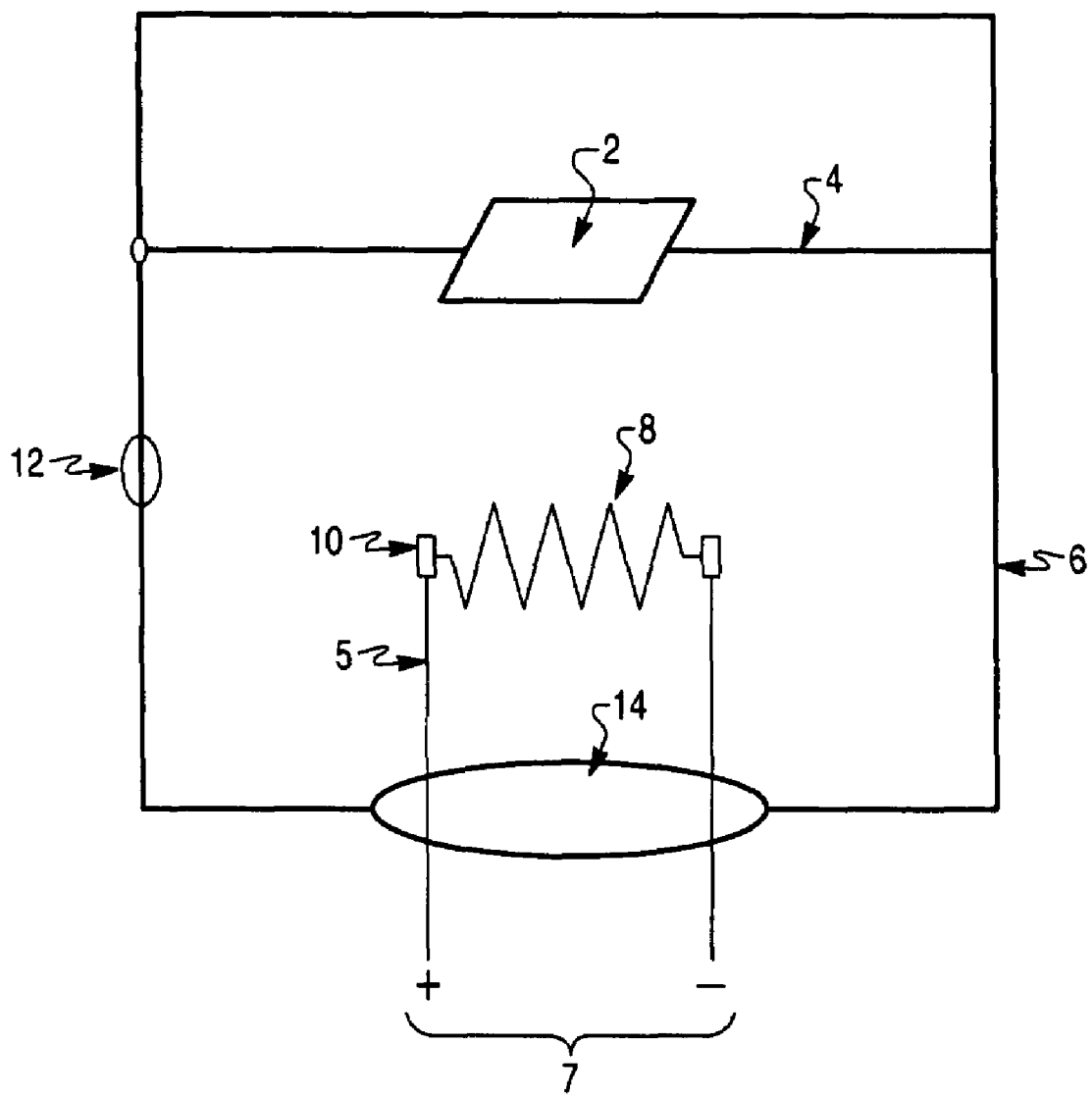
FIG. 2 is a perspective view of a traditional HWCVD apparatus.

A simplified prior art HWCVD apparatus is shown in FIG. 2 wherein a vacuum chamber defined by vacuum chamber walls 6 encloses a substrate 2 mounted on a substrate support member 4 and a filament 8 supported by a filament support member(s) 10. The filament support member(s) 10 can be for example a clamp. A power source 7 is electrically connected to the filament 8 though the electrical feed through 14, via electrical interconnects 5. Deposition is carried out by resistively heating the filament 8 and introducing a precursor gas stream into the vacuum chamber through the precursor gas inlet 12.

In one embodiment, a HWCVD apparatus employs a continuous feed of at least one filament during each deposition run or during successive depositions, preferably without breaking vacuum. As discussed above, the quality of a filament typically diminishes with increased exposure to precursor gases. Therefore, continuously providing a clean portion of a filament at a controlled rate can provide a better and more reproducible deposition conditions. In the case of using a single filament, a used portion of that filament is replaced (at any point along the way) with a clean portion as said filament moves across the vacuum chamber.

In a broad sense, a filament or a filament portion is "used" when it exhibits substantial degradation in surface chemistry. Usually at this point, the filament or filament portion is not desirable for use during deposition. On the other hand, a filament or a filament portion is "clean" when it exhibits negligible or no degradation in surface chemistry. Accordingly, at this point the filament or filament portion is desirable for use during deposition. Usefulness of a filament may be determined by a person skilled in the art of HWCVD.

Figure 3:
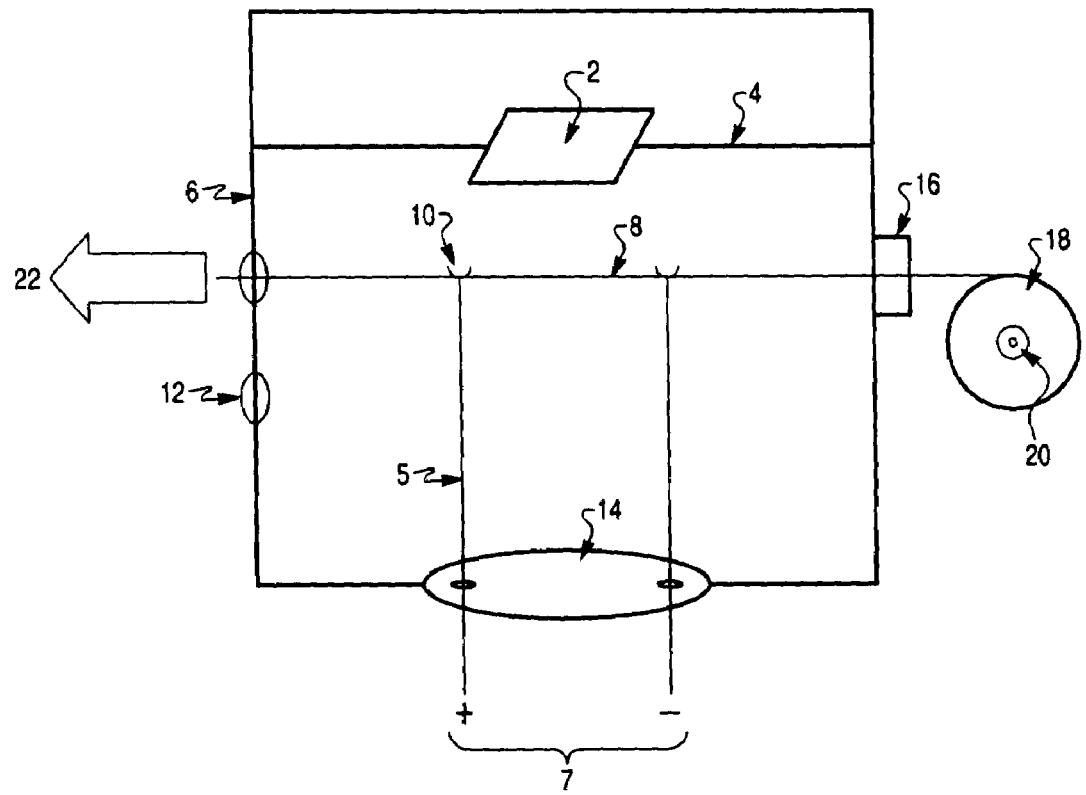
FIG. 3 is a perspective view of a HWCVD apparatus with a continuous filament feed.

There are various ways to continuously feed a filament in a HWCVD apparatus. A device for providing a clean portion of at least one filament can comprise, for example, a spool or roll of a filament. One end of the filament may be moved across the chamber at a desired rate. The device can further comprise a motor element for an automatic feed, or a manually driven mechanism. The spool or roll of the filament may be located inside the vacuum chamber or outside. In one example, a roll of a filament is continuously fed through a vacuum chamber. This example is shown in a non-limiting fashion in FIG. 3. As shown, the HWCVD apparatus comprises a substrate 2 mounted on a substrate support member 4 inside the vacuum chamber walls 6. A roll of a filament material 18 is controllably fed into the vacuum chamber via motor 20. Optionally, the filament 8 is heated in pre-heat chamber 16 prior to entering the vacuum chamber using a motor 20. The filament 8 is supported by the filament support members 10 as it travels through, and eventually out of the vacuum chamber in direction 22. In an optional scenario, a second motor mechanism can pull the filament in direction 22 wherein motor 20 may or may not be also used. The electrical interconnects 5 electrically connect a power source 7 to the filament through the electrical feed through 14 for resistive heating. During deposition, precursor gas is introduced through the precursor gas inlet 12.

The chamber, filament or both may be pre-treated prior to a deposition run. In one example, a heated filament is exposed to the precursor gases for a brief period prior while the substrate is shielded from deposition. Next, the substrate is exposed to the decomposed precursor gas for deposition.

As another aspect of this embodiment, the filament can be provided semi-continuously or step-wise. For example, during a deposition run, with each successive step, a clean portion of the filament is brought adjacent to the substrate while a used portion is removed in a start-stop manner. This stepwise method may also be viewed on a larger time scale, where multiple deposition runs are carried out. For example, it may be desirable to suspend provision of the filament during deposition runs and move the filament in between the runs, for example when the substrate is being changed.

The number of filaments used is not particularly limited. In some cases it may be desirable to provide a plurality of filaments. Furthermore, each of the plurality of filaments may be provided in a manner independent of the other(s).

The configuration of the filaments need not be straight throughout the chamber as shown. For example, one configuration involves a zig-zag of the filament about posts on the filament support member. Of course various other configurations would be apparent to one skilled in the art.

Figure 4:
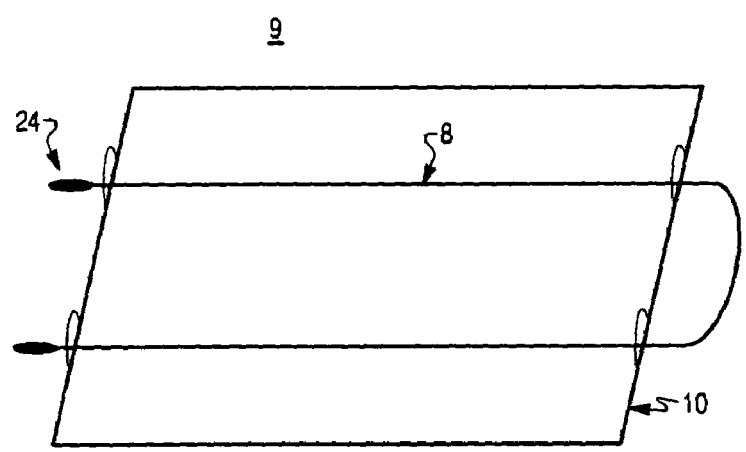
FIG. 4 is a perspective view of a filament assembly.

In another embodiment, a filament assembly is replaced to ensure optimal and/or consistent conditions during deposition, without breaking vacuum. For example, a set of spare filament assemblies can be housed in the vacuum chamber or a load lock attached to the vacuum chamber. After a deposition run, the used filament assembly comprising the used filament is replaced with a spare filament assembly which comprises a clean filament. A filament assembly may comprise more than one filament and in various configurations. A non-limiting example of a filament assembly is depicted in FIG. 4 wherein, a filament 8 is mounted on a filament support member 10 forming said filament assembly 9. The filament support member for example is a solid or hollow electrically insulated frame. A ceramic material is preferred for the portion of the filament support member 10 in contact with the filament 8. Electrical connects 24 are formed at the ends of the filament for engaging a power source when the assembly is installed for use. In this embodiment, there may or may not be a pre-treatment step in or before the layer deposition, as described above.

Figure 5:
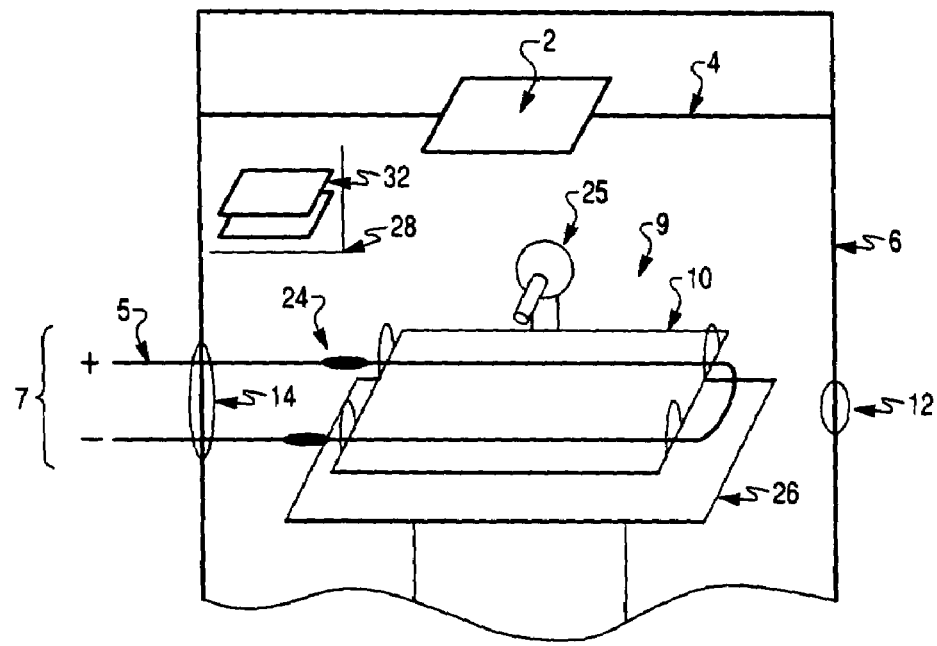
FIG. 5 is a perspective view of a HWCVD apparatus comprising filament assemblies and a device for relocating same.

FIG. 5 is another non-limiting example of a HWCVD apparatus wherein the filament assemblies are replaced for ensuring consistent and/or optimal deposition conditions. As shown, inside the vacuum chamber, defined by vacuum chamber walls 6, a substrate 2 is mounted on a substrate support member 4 and facing a filament assembly 9 mounted on a mechanical support 26 which comprises a filament support member 10. A set of spare filament assemblies 32 are located inside the vacuum chamber and spaced/positioned with respect to the precursor gas inlet 12 such that during deposition the filaments of the spare assemblies 32, experience no or minimal exposure to the precursor gases. Optionally, a shield 28 is placed adjacent to the spare assemblies 32 to further minimize exposure thereof to the precursor gases. The power source 7 is connected to the filament assembly 9 via the electrical interconnects 5 and the electrical contacts 24 through the electrical feed through 14. A device 25 for moving and replacing a filament assembly 9 can be manually operated by the HWCVD operator to replace a filament assembly 9 comprising a used filament, with a spare assembly 32, comprising a clean filament. Alternatively, device 25 may be automated. For example, device 25 may be a robot arm which is operated by a computer. In general, device 25 may be a mechanism able to engage and disengage a filament assembly to reposition the same.

Figure 6:
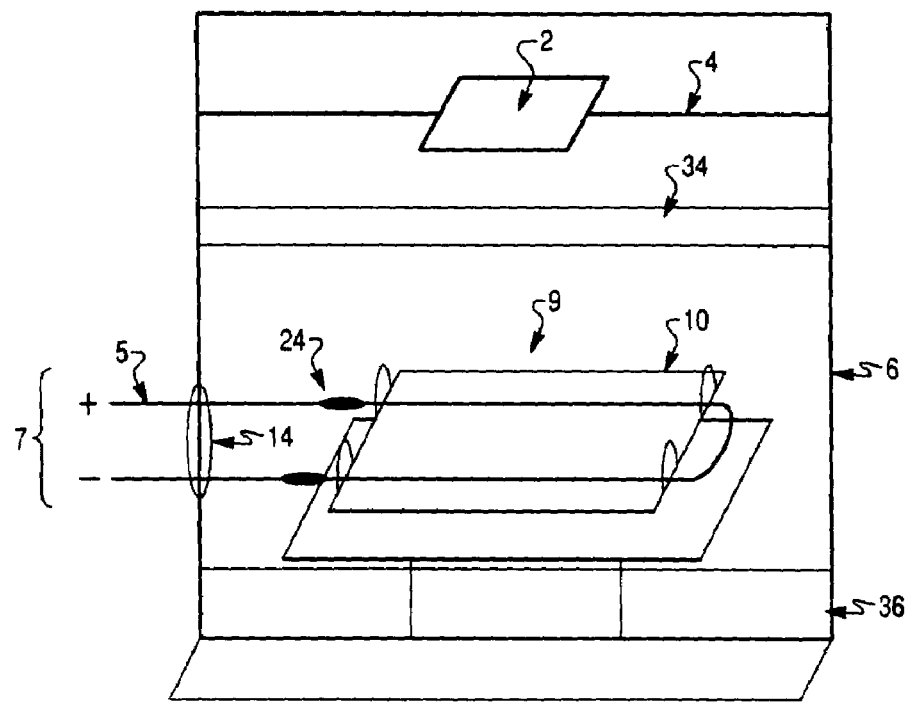
FIG. 6 is a perspective view of a HWCVD apparatus comprising a mechanism for switching filament assemblies.

In yet another non-limiting example shown in FIG. 6, a substrate 2 is mounted on a substrate support member 4 inside a vacuum chamber. The vacuum chamber includes a gate valve (partition) 34. The valve 34 is closed to separate the substrate from the filament assembly 9 during assembly 9 switch out, and open during layer deposition. During switch out, the gate valve 34 is closed and the filament assembly 9 is replaced with a spare filament assembly (not shown) through port 36. Connected to port 36 is another chamber (not shown) such as a load lock, that houses spare assemblies. For example, between deposition runs, the gate valve 34 is closed, the filament assembly 9 is removed and a spare assembly is inserted through port 36 and mounted on the filament assembly support 10 without breaking vacuum around the substrate 2. The new filament assembly is then connected to the power source 7 as described in the previous example. Next, the gate valve 34 is opened to allow for another deposition run. A precursor gas inlet (not shown) can be located on the substrate side or filament assembly side of the chamber.

In another embodiment, a clean portion of a filament is provided by cleaning a used filament, preferably without breaking vacuum. As previously mentioned, deposition of precursor materials can change filament surface chemistry over time. For example, a tungsten filament, during deposition of silane, may grow a layer of tungsten silicide and/or amorphous silicon thereon. Such layers may be etched chemically with various compounds. For example, in between deposition runs, the used filaments can be exposed to etchant gases, such for example atomic hydrogen, ammonia, or nitrogen tetrafluoride ($NF_3$). In this case, the vacuum chamber may comprise an additional gas inlet for the etching species or the precursor gas inlet may be switched to an etchant source in between deposition runs. Alternatively, a used filament may be exposed to a plasma from a plasma source for cleaning. Alternatively, a used filament may be mechanically cleaned by contact with an abrasive surface. For example, the filament can be moved through an aperture lined with an abrasive during entry into or exit from the vacuum chamber. As yet another alternative, a filament can be cleaned by heating the same to elevated temperatures between deposition runs. Any of the aforementioned methods may be combined to obtain a clean filament.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

What is claimed is:

1. A method of performing hot wire chemical vapor deposition, comprising:
   providing a substrate inside a vacuum chamber;
   generating a vacuum in the vacuum chamber;
   providing a stream of a precursor gas at a pressure ranging from about 10 to about 200 mTorr into the vacuum chamber to deposit a layer on the substrate and to generate a used portion of at least one catalyst filament positioned adjacent to the substrate; and
   providing a clean portion of the at least one catalyst filament in the vacuum chamber without breaking vacuum, wherein said providing comprises feeding the at least one filament into the vacuum chamber.

2. The method of claim 1 wherein the step of providing a clean portion of the at least one catalyst filament comprises continuously feeding at least one filament into the vacuum chamber.

3. The method of claim 1 wherein the step of providing a clean portion of the at least one catalyst filament comprises semi-continuously feeding at least one filament into the vacuum chamber.

* * * * *